United States Patent
Park et al.

(10) Patent No.: US 7,889,552 B2
(45) Date of Patent: Feb. 15, 2011

(54) NON-VOLATILE SEMICONDUCTOR DEVICE

(75) Inventors: Jae-chul Park, Seoul (KR); Jae-woong Hyun, Uijeongbu-si (KR); Young-soo Park, Yongin-si (KR); Sun-il Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 437 days.

(21) Appl. No.: 12/068,409

(22) Filed: Feb. 6, 2008

(65) Prior Publication Data
US 2009/0003062 A1    Jan. 1, 2009

(30) Foreign Application Priority Data
Jun. 29, 2007    (KR) .................. 10-2007-0065684

(51) Int. Cl.
*G11C 11/34* (2006.01)
*G11C 16/04* (2006.01)
(52) U.S. Cl. ................. 365/185.05; 365/185.02; 365/185.17; 257/319; 257/320
(58) Field of Classification Search ............ 365/185.02, 365/185.05, 185.17, 185.25; 257/319, 320, 257/E21.662, E21.682
See application file for complete search history.

(56) References Cited

U.S. PATENT DOCUMENTS

| | | | | |
|---|---|---|---|---|
| 5,172,198 A | * | 12/1992 | Aritome et al. | 365/185.17 |
| 6,295,227 B1 | * | 9/2001 | Sakui et al. | 365/185.17 |
| 7,382,649 B2 | * | 6/2008 | Matsunaga et al. | 365/185.05 |

* cited by examiner

*Primary Examiner*—Tuan T Nguyen
*Assistant Examiner*—Toan Le
(74) *Attorney, Agent, or Firm*—Harness, Dickey & Pierce, P.L.C.

(57) ABSTRACT

A nonvolatile semiconductor device according to example embodiments may include a plurality of memory cells on a semiconductor substrate and at least one selection transistor on the semiconductor substrate, wherein the at least one selection transistor may be disposed at a different level from the plurality of memory cells. The at least one selection transistor may be connected to a data line and/or a power source line via a first contact and/or a third contact, respectively. The at least one selection transistor may be connected to the plurality of memory cells via a second contact and/or a fourth contact. The active layer of the at least one selection transistor may contain an oxide. Accordingly, the nonvolatile semiconductor device according to example embodiments may include a selection transistor having a reduced size.

19 Claims, 5 Drawing Sheets

NON-VOLATILE SEMICONDUCTOR DEVICE

PRIORITY STATEMENT

This application claims the benefit under 35 U.S.C. §119 of Korean Patent Application No. 10-2007-0065684, filed on Jun. 29, 2007 in the Korean Intellectual Property Office (KIPO), the entire contents of which are incorporated herein by reference.

BACKGROUND

1. Technical Field

Example embodiments relate to a nonvolatile semiconductor device having a selection transistor.

2. Description of the Related Art

Nonvolatile memory devices may retain data even after power has been discontinued. A representative example of a nonvolatile memory device may include a flash memory. A flash memory may include a cell transistor having a control gate, a floating gate, a source, and a drain. The cell transistor may be programmed or erased according to a F-N tunneling mechanism.

Erasing may be performed on a cell transistor by applying a ground voltage to the control gate of the cell transistor and a voltage greater than a supply voltage to a semiconductor substrate (or a bulk) thereof. Under such an erasing bias condition, a relatively strong electric field may be formed between the floating gate and the bulk due to the relatively large difference between the voltages of the floating gate and the bulk. As a result, electrons present at the floating gate may discharge to the bulk due to an F-N tunneling effect. Consequently, a threshold voltage of the erased cell transistor may decrease.

Programming may be performed on the cell transistor by applying a voltage greater than the supply voltage to the control gate and a ground voltage to the drain and the bulk. Under such a bias condition, electrons may be injected into the floating gate of the cell transistor due to the F-N tunneling effect. As a result, the threshold voltage of the programmed cell transistor may increase. A state in which the electrons are injected into the floating gate may be referred to as a programming state, and a state in which electrons do not exist in the floating gate may be referred to as an erasing state. The threshold voltage of the programmed cell transistor may be greater than about 0 volts, and the threshold voltage of the erased cell transistor may be less than about 0 volts.

Selection transistors may be used to write data to (or read data from) or to apply a predetermined voltage to the cell transistor. The sizes of cell transistors and selection transistors may be reduced to decrease the size of a nonvolatile semiconductor device. However, there may be restrictions in reducing the size of selection transistors due to leakage currents flowing through the selection transistors.

SUMMARY

A nonvolatile semiconductor device according to example embodiments may include a selection transistor provided at a different level from a plurality of memory cells. A contact via may connect the selection transistor to a bit line and/or a common source line. An active layer of the selection transistor may include an oxide. The nonvolatile semiconductor device may be a NAND flash memory device.

Example embodiments may relate to a nonvolatile semiconductor device including a plurality of memory cells on a semiconductor substrate and at least one selection transistor on the semiconductor substrate. The at least one selection transistor may be at a different level from the plurality of memory cells. At least one of a first contact and third contact may connect the at least one selection transistor to at least one of a bit line and a common source line. At least one of a second contact and fourth contact may connect the at least one selection transistor to the plurality of memory cells. The first contact and/or third contact may connect the selection transistor to the bit line and/or the common source line, respectively, via a first doped region of the semiconductor substrate.

Example embodiments may also relate to a nonvolatile semiconductor device including a plurality of memory cells on a semiconductor substrate and at least one selection transistor on the semiconductor substrate, the at least one selection transistor having an active layer including an oxide. The at least one selection transistor may be at a different level from the plurality of memory cells.

Example embodiments may additionally relate to a nonvolatile semiconductor device including a plurality of memory cells and at least one selection transistor connecting the plurality of memory cells to a bit line or disconnecting the plurality of memory cells from the bit line. The at least one selection transistor may have a control gate and an active layer including an oxide.

Example embodiments may further relate to a nonvolatile semiconductor device including a plurality of word line patterns on a semiconductor substrate and at least one selection line pattern on the semiconductor substrate. The active layer of the at least one selection line pattern may include an oxide, and the at least one selection line pattern may be at a different level from the plurality of word line patterns. The word line patterns may act as memory cell transistors, and the selection line patterns may act as selection line transistors that connect the memory cell transistors to a data line and/or a power source line or disconnect the memory cell transistors from the data line and/or the power source line.

DETAILED DESCRIPTION OF EXAMPLE EMBODIMENTS

Figure 1:
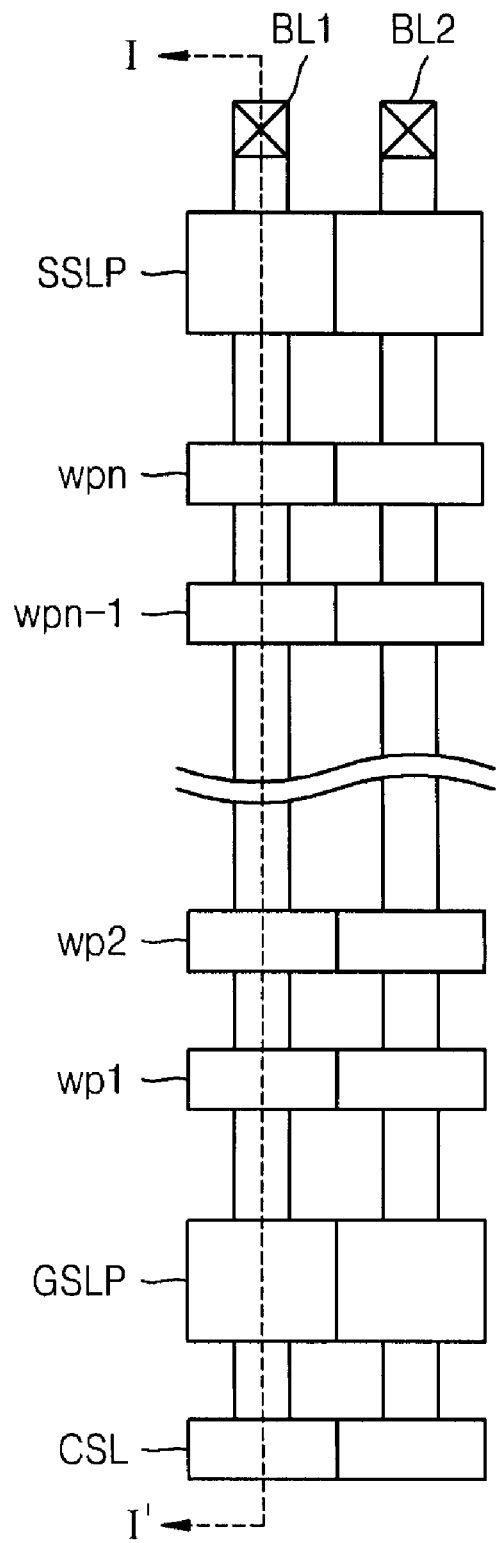
FIG. 1 is a plan view of a part of a nonvolatile semiconductor device according to example embodiments.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is a plan view of a part of a semiconductor device according to example embodiments. Referring to FIG. 1, the semiconductor device may include one or more selection line patterns and a plurality of word line patterns $WP_1$, $WP_2$, ... $WP_{n-1}$, and $WP_n$. The selection line patterns may include a ground selection line pattern GSLP and a string selection line pattern SSLP. The selection line patterns GSLP and SSLP and the word line patterns $WP_1$ through $WP_n$ may be formed on a semiconductor substrate.

Each of the selection line patterns GSLP and SSLP and corresponding adjacent doped regions (not shown) may act as a selection transistor. Each of the word line patterns $WP_1$ through $WP_n$ and corresponding adjacent doped regions (not shown) may act as a memory cell transistor. The selection transistors may connect the memory cell transistors to a data line (e.g., bit line) and/or a power source line (e.g., common source line). Conversely, the selection transistors may disconnect the memory cell transistors from the data line and/or the power source line to read/write data to/from the memory cell transistor or to apply a predetermined voltage to the memory cell transistors. The selection line patterns GSLP and SSLP and the word line patterns $WP_1$ through $WP_n$ may be formed on the semiconductor substrate in different layers or in the same layer.

Figure 2:
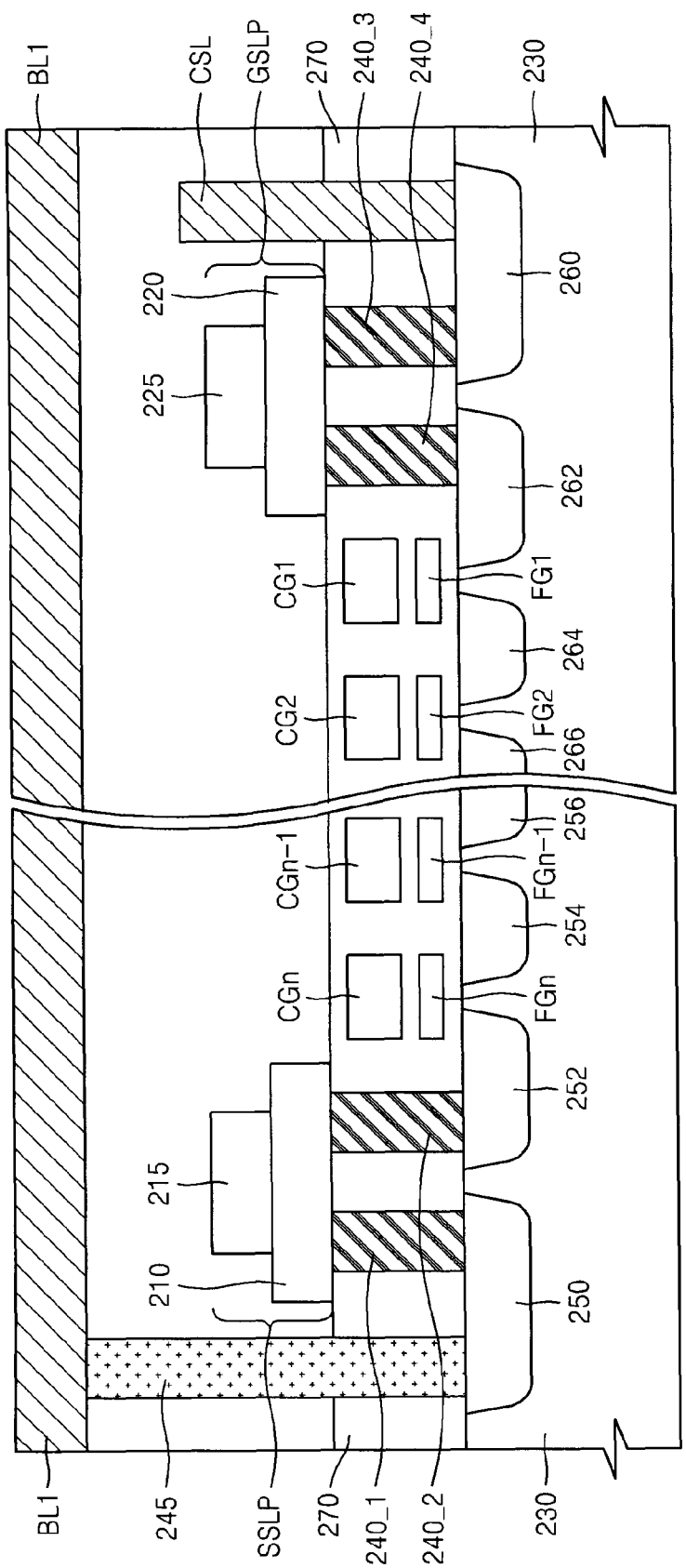
FIG. 2 is a cross-sectional view of a part of the nonvolatile semiconductor device of FIG. 1, taken along line I-I'.

FIG. 2 is a cross-sectional view of a part of the semiconductor device of FIG. 1, taken along line I-I'. Each of the word line patterns $WP_1$ through $WP_n$ (FIG. 1) may include a control gate and a floating gate. Referring to FIG. 2, word line pattern $WP_1$ may include a control gate $CG_1$ and a floating gate $FG_1$. Word line pattern $WP_2$ may include a control gate $CG_2$ and a floating gate $FG_2$. Word line pattern $WP_{n-1}$ may include a control gate $CG_{n-1}$ and a floating gate $FG_{n-1}$. Word line pattern $WP_n$ may include a control gate $CG_n$ and a floating gate $FG_n$.

A first contact 240_1 and a second contact 240_2 may be connected to the string selection line pattern SSLP. A third contact 240_3 and a fourth contact 240_4 may be connected to the ground selection line pattern GSLP. The first contact 240_1 may connect a bit line BL1 (e.g., data line) to the string selection line pattern SSLP. The third contact 240_3 may connect a common source line CSL (e.g., power source line) to the ground selection line pattern GSLP. The second contact 240_2 may connect the string selection line pattern SSLP to the word line patterns $WP_1$ through $WP_n$ (FIG. 1). The fourth contact 240_4 may connect the ground selection line pattern GSLP to the word line patterns $WP_1$ through $WP_n$ (FIG. 1). The first contact 240_1 may connect the bit line BL1 to the string selection line pattern SSLP via a doped region 250 of the semiconductor substrate 230 and a conductive plug 245. The third contact 240_3 may connect the common source line CSL to the ground selection line pattern GSLP via a doped region 260 of the semiconductor substrate 230.

A nonvolatile semiconductor device according to example embodiments may include selection line patterns GSLP and SSLP formed in a different layer from the memory cells and the first contact 240_1 and third contact 240_3. For example, the memory cells may be formed in a layer 270 below the selection line patterns GSLP and SSLP. Accordingly, the sizes of the selection transistors embodied as the selection line patterns GSLP and SSLP may be reduced. Hereinafter, semiconductor devices according to example embodiments will be described with reference to a bit line as a data line and a common source line as a power source line. However, the bit line and common source line are not limited to the data line and power source line, respectively.

The ground selection line pattern GSLP may embody a ground selection transistor, and the string selection line pattern SSLP may embody a string selection transistor. The ground selection transistor (embodied using the ground selection line pattern GSLP) may connect the memory cell transistors (embodied using the word line patterns $WP_1$ through $WP_n$) to a common source line CSL or may disconnect the memory cell transistors from the common source line CSL. The string selection transistor (embodied using the string selection line pattern SSLP) may connect the memory cell transistors (embodied using the word line patterns $WP_1$ through $WP_n$) to bit lines BL1 and/or BL2 (FIG. 1) or may disconnect the memory cell transistors from the bit lines BL1 and/or BL2 (FIG. 1). The bit lines BL1 and BL2 may form a bit line pair or may act as independent bit lines.

Referring to FIG. 2, a ground selection line pattern GSLP, word line patterns $WP_1$ through $WP_n$ (FIG. 1), and a string selection line pattern SSLP may be formed on a semiconductor substrate 230. The ground selection line pattern GSLP may include a ground control gate 225 and a ground active layer 220, and the string selection line pattern SSLP may include a string control gate 215 and a string active layer 210. The ground active layer 220 and the string active layer 210 may contain an oxide.

Doped regions 250-256 and 260-266 may be formed so as to correspond to the ground selection line pattern GSLP, the word line patterns $WP_1$ through $WP_n$, and the string selection line pattern SSLP. For example, doped regions 260 and 262 may be formed at both sides of the ground selection line pattern GSLP, and doped regions 250 and 252 may be formed at both sides of the string selection line pattern SSLP. Doped regions 250-256 and 260-266 may also be shared by the ground selection line pattern GSLP, the word line patterns $WP_1$ through $WP_n$, and the string selection line pattern SSLP. For example, doped region 262 may be shared by the word line pattern $WP_1$ and the ground selection line pattern GSLP, and doped region 264 may be shared by the word line pattern $WP_1$ and the word line pattern $WP_2$.

The word line pattern $WP_1$ and the adjacent doped regions 262 and 264 may act as a memory cell transistor. The control gate $CG_1$ and the floating gate $FG_1$ of the word line pattern $WP_1$ may act as the gate of the memory cell transistor. Doped region 262 and doped region 264 may act as the source and drain, respectively, of the memory cell transistor.

Doped regions 260 and 262 and the ground selection line pattern GSLP may act as a ground selection transistor. The ground control gate 225 and the ground active layer 220 of the ground selection line pattern GSLP may act as the gate of the ground selection transistor. Doped region 260 and doped region 262 adjoining the ground selection line pattern GSLP may act as the source and drain, respectively, of the ground selection transistor. Doped regions 250 and 252 and the string selection line pattern SSLP may act as a string selection transistor. The string control gate 215 and the string active layer 210 of the string selection line pattern SSLP may act as the gate of the string selection transistor. Doped region 250 and doped region 252 adjoining the string selection line pattern SSLP may act as the source and drain, respectively, of the string selection transistor.

The ground active layer 220 of the ground selection line pattern GSLP and the string active layer 210 of the string selection line pattern SSLP may contain an oxide. For example, the ground active layer 220 and the string active layer 210 may be formed of an oxide. Accordingly, the turn-off current amount for the ground selection transistor and the string selection transistor may be reduced.

Figure 3A:
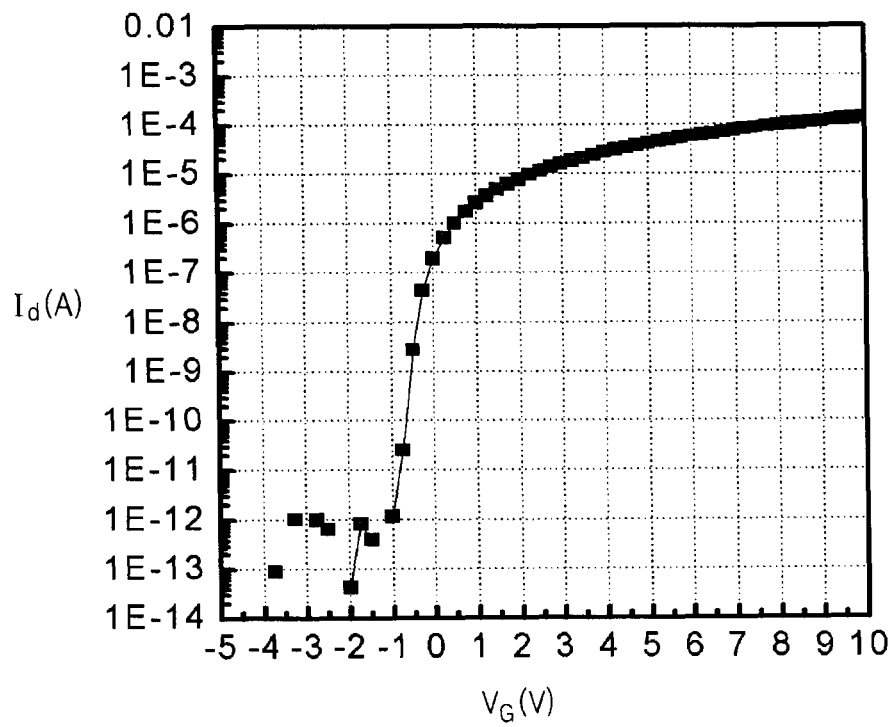
FIG. 3A is a graph illustrating the transfer characteristics of a transistor according to example embodiments having an active layer formed of an oxide.
Figure 3B:
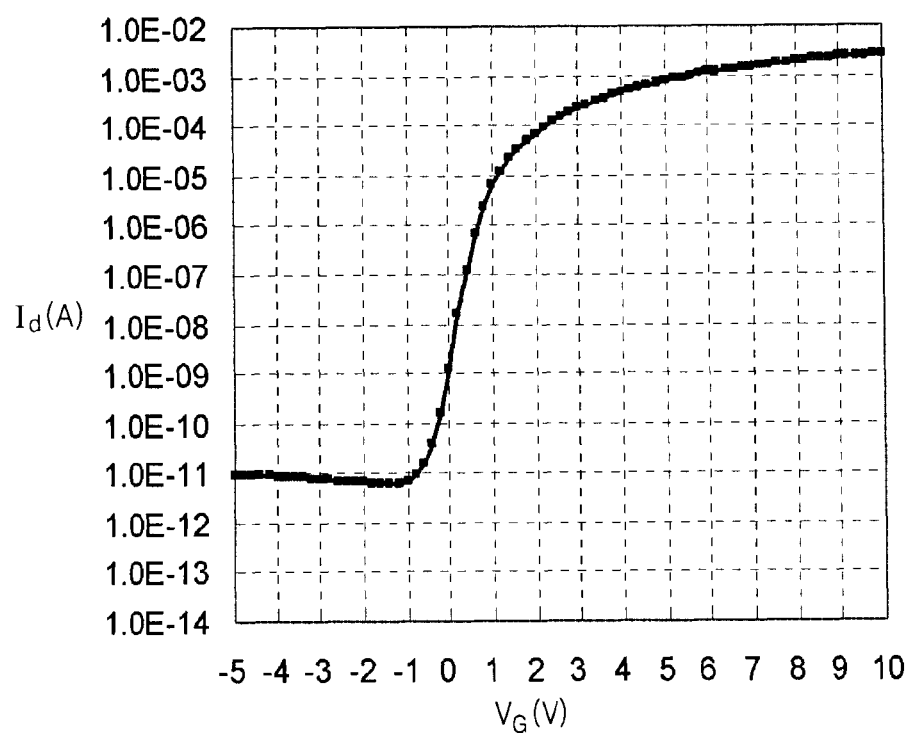
FIG. 3B is a graph illustrating the transfer characteristics of a conventional transistor having an active layer formed of a polysilicone.

FIG. 3A is a graph illustrating the transfer characteristics of a transistor according to example embodiments having an active layer formed of an oxide. FIG. 3B is a graph illustrating the transfer characteristics of a conventional transistor having an active layer formed of a polysilicone. Referring to FIG. 3A, the turn-off current of a transistor according to example embodiments having an active layer formed of an oxide is about 1 pA. However, referring to FIG. 3B, the turn-off current of a conventional transistor having an active layer formed of a polysilicone is about 10 pA. Thus, the turn-off current amount for a ground selection transistor and a string selection transistor may be reduced by forming the ground active layers 220 and string active layer 210 with an oxide. Because the turn-off current amount may be reduced, the size of the selection transistors may also be reduced.

Additionally, manufacturing processes for active layers formed of an oxide may be simplified. For example, to form a transistor having an active layer formed of a polysilicone, a doping process and a thermal process for activation may be needed. However, if the active layer of a transistor is formed of an oxide, the doping process and the thermal process may not be needed, thereby simplifying the manufacturing process.

Referring to FIG. 2, the ground selection line pattern GSLP and the string selection line pattern SSLP may be formed in a layer where the word line patterns $WP_1$ through $WP_n$ are not formed. For example, FIG. 2 illustrates that the ground selection line pattern GSLP and the string selection line pattern SSLP may be arranged above a layer 270 where the word line patterns $WP_1$ through $WP_n$ are arranged. Alternatively, the ground selection line pattern GSLP and/or the string selection line pattern SSLP may be arranged below a layer 270 where the word line patterns $WP_1$ through $WP_n$ are arranged. In a further alternative, only one of the ground selection line pattern GSLP and the string selection line pattern SSLP may be arranged in a layer where the word line patterns $WP_1$ through $WP_n$ are not arranged.

Referring to FIG. 2, a semiconductor device according to example embodiments may include one or more contacts 240_1, 240_2, 240_3, and 240_4. The contacts 240_1 through 240_4 may connect the active layer of the selection transistors (e.g., ground selection transistor, string selection transistor) to a data line (e.g., bit line) and/or a power source line (e.g., common source line). The ground selection line pattern GSLP and the string selection line pattern SSLP may be formed in a layer where the word line patterns $WP_1$ through $WP_n$ are not formed. The ground selection line pattern GSLP and the string selection line pattern SSLP may also be formed in a layer where the doped regions 250-256 and 260-266 are not formed. Contacts 240_1, 240_2, 240_3, and/or 240_4 may connect the elements formed in different layers. First contact 240_1 may connect the string selection line pattern SSLP to the bit line BL1. Third contact 240_3 may connect the ground selection line pattern GSLP to the common source line CSL. Second contact 240_2 may connect the string selection line pattern SSLP to the memory cell transistors. Fourth contact 240_4 may connect the ground selection line pattern GSLP to the memory cell transistors.

The first contact 240_1 may connect the string selection transistor to the bit line BL1, and the second contact 240_2 may connect the string selection transistor to the memory cell transistors. The first contact 240_1 may connect the string selection transistor to the bit line BL1 via the doped region 250 of the semiconductor substrate 230. The second contact 240_2 may connect the string selection transistor to the memory cell transistor via the doped region 252. The third contact 240_3 may connect the ground selection transistor to the common source line CSL, and the fourth contact 240_4 may connect the ground selection transistor to the memory cell transistors. The third contact 240_3 may connect the ground selection transistor to the common source line CSL via the doped region 260 of the semiconductor substrate 230. The fourth contact 240_4 may connect the ground selection transistor to the memory cell transistor via the doped region 262.

Figure 4:
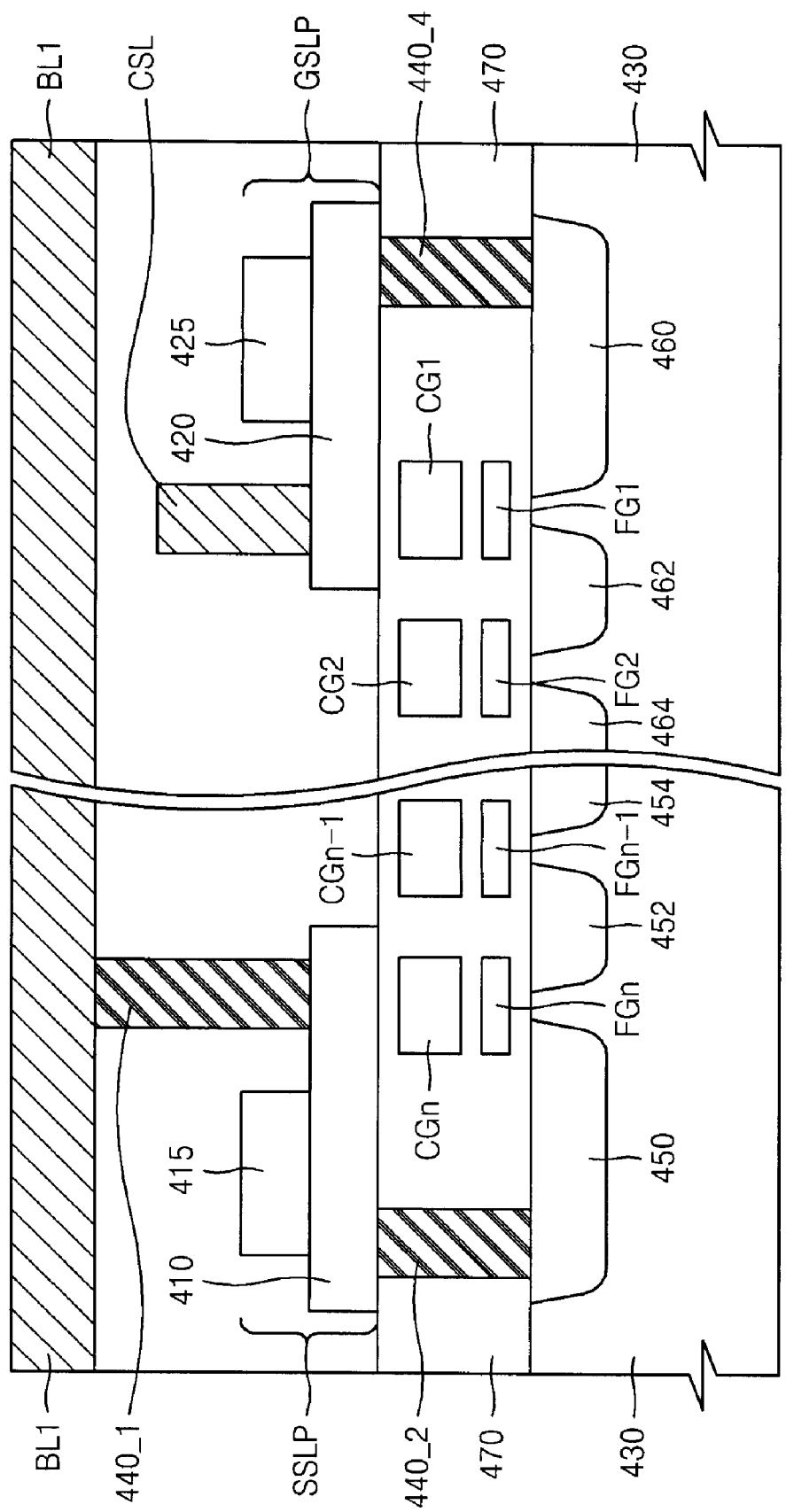
FIG. 4 is a cross-sectional view of a part of another nonvolatile semiconductor device according to example embodiments.

FIG. 4 is a cross-sectional view of a part of another semiconductor device according to example embodiments. The semiconductor device illustrated in FIG. 4 will be described in terms of its differences with the semiconductor device illustrated in FIG. 2. In the semiconductor device illustrated in FIG. 2, the first contact 240_1 may connect the string selection transistor to the bit line BL1 via the doped region 250, and the third contact 240_3 may connect the ground selection transistor to the common source line CSL via the doped region 260. However, in the semiconductor device of FIG. 4, a first contact 440_1 may directly connect a string selection transistor to a bit line BL1, and a common source line CSL may be directly connected to a ground selection transistor. Thus, in the semiconductor device of FIG. 4, the length of a string including a string selection transistor, memory cell transistor, ground selection transistor may be reduced.

Referring to FIG. 4, a string selection line pattern SSLP may include a string control gate 415 and a string active layer 410, and a ground selection line pattern GSLP may include a ground control gate 425 and a ground active layer 420. Word line patterns $WP_1$ through $WP_n$ may be provided in a layer 470 below the string selection line pattern SSLP and the ground selection line pattern GSLP. Word line pattern $WP_1$ may include a control gate $CG_1$ and a floating gate $FG_1$. Word line pattern $WP_2$ may include a control gate $CG_2$ and a floating gate $FG_2$. Word line pattern $WP_{n-1}$ may include a control gate $CG_{n-1}$ and a floating gate $FG_{n-1}$. Word line pattern $WP_n$ may include a control gate $CG_n$ and a floating gate $FG_n$. Doped regions 450-454 and 460-464 may be provided in the semiconductor substrate 430. Each of the word line patterns $WP_1$ through $WP_n$ and corresponding adjacent doped regions 450-454 and 460-464 may act as a memory cell transistor. A second contact 440_2 may connect the string selection line pattern SSLP to the word line pattern $WP_n$ via doped region 450. A fourth contact 440_4 may connect the ground selection line pattern GSLP to the word line pattern $WP_1$ via doped region 460.

Figure 5:
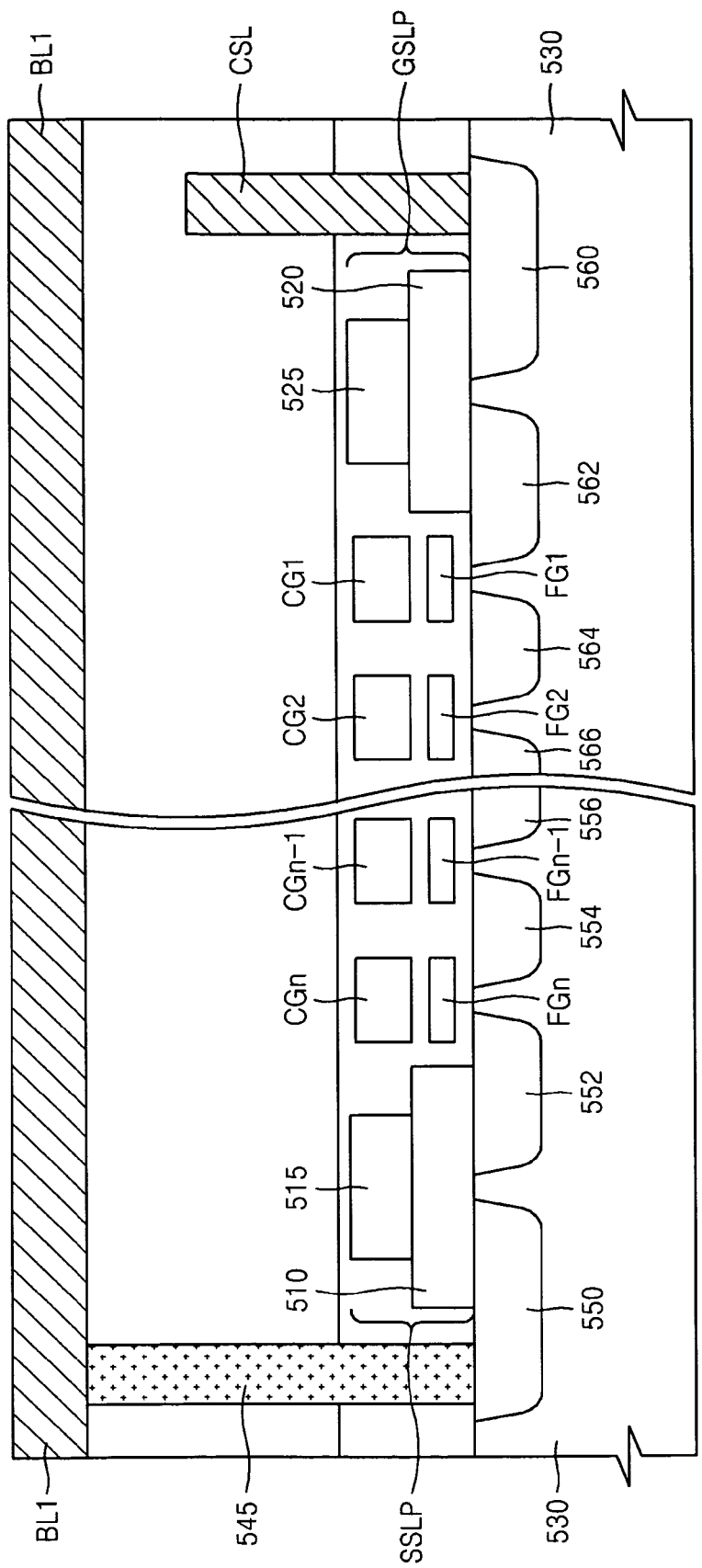
FIG. 5 is a cross-sectional view of a part of another nonvolatile semiconductor device according to example embodiments.

FIG. 5 is a cross-sectional view of a part of another semiconductor device according to example embodiments. The semiconductor device illustrated in FIG. 5 will be described in terms of its differences with the nonvolatile semiconductor devices illustrated in FIGS. 2 and 4. In the semiconductor devices of FIGS. 2 and 4, the ground selection line pattern GSLP and the string selection line pattern SSLP may be formed in a layer where the word line patterns $WP_1$ through $WP_n$ are not formed. However, in the semiconductor device of FIG. 5, a ground selection line pattern GSLP and a string selection line pattern SSLP may be formed in the same layer where a plurality of word line patterns $WP_1$ through $WP_n$ are also formed. In the semiconductor device of FIG. 5, the string active layer 510 of the string selection line pattern SSLP and the ground active layer 520 of the ground selection line pattern GSLP may be formed of an oxide. Accordingly, the semiconductor device of FIG. 5 may reduce the amount of turn-off current for selection transistors and may be manufactured using a simpler process.

Referring to FIG. 5, a string selection line pattern SSLP may include a string control gate 515 and a string active layer 510, and a ground selection line pattern GSLP may include a ground control gate 525 and a ground active layer 520. Word line patterns $WP_1$ through $WP_n$ may be provided in the same layer as the string selection line pattern SSLP and the ground selection line pattern GSLP. Word line pattern $WP_1$ may include a control gate $CG_1$ and a floating gate $FG_1$. Word line pattern $WP_2$ may include a control gate $CG_2$ and a floating gate $FG_2$. Word line pattern $WP_{n-1}$ may include a control gate $CG_{n-1}$ and a floating gate $FG_{n-1}$. Word line pattern $WP_n$ may include a control gate $CG_n$ and a floating gate $FG_n$. Doped regions 550-556 and 560-566 may be provided in the semiconductor substrate 530. Each of the word line patterns $WP_1$ through $WP_n$ and corresponding adjacent doped regions 550-556 and 560-566 may act as a memory cell transistor. The string selection transistor may be connected to a bit line BL1 via a doped region 550 and a conductive plug 545. The ground selection transistor may be connected to common source line CSL via a doped region 560. The ground selection transistor may be connected to a memory cell transistor via doped region 562, and the string selection transistor may be connected to a memory cell transistor via doped region 552.

As described above, a nonvolatile semiconductor device according to example embodiments may include one or more selection transistors formed in a layer where a plurality of memory cells are not formed and may also include contacts connecting the selection transistors to a data line and/or a power source line, thereby reducing the sizes of the selection transistors. Additionally, an active layer of the selection transistors may be formed of an oxide, thus decreasing the amount of turn-off current compared to conventional selection transistors having the same or similar length. Accordingly, the sizes of the selection transistors may be reduced.

While example embodiments have been disclosed herein, it should be understood that other variations may be possible. Such variations are not to be regarded as a departure from the spirit and scope of example embodiments of the present disclosure, and all such modifications as would be obvious to one skilled in the art are intended to be included within the scope of the following claims.

What is claimed is:

1. A nonvolatile semiconductor device comprising:
    a plurality of memory cells on a semiconductor substrate; and
    at least one selection transistor on the semiconductor substrate,
    wherein the at least one selection transistor is at a different level from the plurality of memory cells, at least one of a first contact and third contact connects the at least one selection transistor to at least one of a bit line and a common source line, and at least one of a second contact and fourth contact connects the at least one selection transistor to the plurality of memory cells.

2. The nonvolatile semiconductor device of claim 1, wherein at least one of the first contact and third contact connects the at least one selection transistor to at least one of the bit line and the common source line via a first doped region of the semiconductor substrate.

3. The nonvolatile semiconductor device of claim 1, wherein the at least one selection transistor includes:
    a string selection transistor connecting the plurality of memory cells to the bit line or disconnecting the plurality of memory cells from the bit line; and a ground selection transistor connecting the plurality of memory cells to the common source line or disconnecting the plurality of memory cells from the common source line.

4. The nonvolatile semiconductor device of claim 3, wherein:
the first contact connects the string selection transistor to the bit line via a first doped region of the semiconductor substrate; and
the second contact connects the string selection transistor to the plurality of memory cells.

5. The nonvolatile semiconductor device of claim 3, wherein:
the third contact connects the ground selection transistor to the common source line via a first doped region of the semiconductor substrate; and
the fourth contact connects the ground selection transistor to the plurality of memory cells.

6. The nonvolatile semiconductor device of claim 1, wherein the plurality of memory cells includes a plurality of word line patterns, and the at least one selection transistor includes at least one selection line pattern.

7. A nonvolatile semiconductor device comprising:
a plurality of memory cells on a semiconductor substrate;
at least one selection transistor on the semiconductor substrate and having an active layer including an oxide; and
at least one contact connecting the active layer to at least one of a bit line and a common source line,
wherein the at least one selection transistor is at a different level from the plurality of memory cells.

8. The nonvolatile semiconductor device of claim 7, wherein the at least one selection transistor is on a level above the plurality of memory cells.

9. The nonvolatile semiconductor device of claim 7, wherein the at least one selection transistor includes:
a string selection transistor connecting the plurality of memory cells to a bit line or disconnecting the plurality of memory cells from the bit line; and
a ground selection transistor connecting the plurality of memory cells to a common source line or disconnecting the plurality of memory cells from the common source line.

10. The nonvolatile semiconductor device of claim 9, further comprising:
a first contact connecting the string selection transistor to the bit line; and
a second contact connecting the string selection transistor to the plurality of memory cells.

11. The nonvolatile semiconductor device of claim 10, wherein the first contact connects the string selection transistor to the bit line via a first doped region of the semiconductor substrate.

12. The nonvolatile semiconductor device of claim 10, wherein the first contact directly connects the string selection transistor to the bit line.

13. The nonvolatile semiconductor device of claim 9, further comprising:
a third contact connecting the ground selection transistor to the common source line; and
a fourth contact connecting the ground selection transistor to the plurality of memory cells.

14. The nonvolatile semiconductor device of claim 13, wherein the third contact connects the ground selection transistor to the common source line via a first doped region of the semiconductor substrate.

15. The nonvolatile semiconductor device of claim 7, wherein the plurality of memory cells are NAND flash memory cells.

16. A nonvolatile semiconductor device comprising:
a plurality of memory cells; and
at least one selection transistor connecting the plurality of memory cells to a bit line or disconnecting the plurality of memory cells from the bit line,
wherein the at least one selection transistor includes a control gate and an active layer including an oxide and the at least one selection transistor is at the same level as one or more of the plurality of memory cells.

17. A nonvolatile semiconductor device comprising:
a plurality of word line patterns on a semiconductor substrate;
at least one selection line pattern on the semiconductor substrate, the at least one selection line pattern including an active layer; and
at least one contact connecting the active layer to at least one of a bit line and a common source line,
wherein the active layer of the at least one selection line pattern includes an oxide, and the at least one selection line pattern is at a different level from the plurality of word line patterns.

18. The nonvolatile semiconductor device of claim 17, wherein the at least one selection line pattern is on a level above the plurality of word line patterns.

19. The nonvolatile semiconductor device of claim 17, wherein the at least one selection line pattern includes a string selection line pattern directly connected to the bit line by the at least one contact.

* * * * *